United States Patent
Pizzella et al.

(10) Patent No.: US 12,347,703 B2
(45) Date of Patent: Jul. 1, 2025

(54) SYSTEMS AND METHODS FOR DETECTING THE PRESENCE OF DEPOSITS IN FLUID FLOW CONDUITS

(71) Applicant: Watlow Electric Manufacturing Company, St. Louis, MO (US)

(72) Inventors: Miranda P. Pizzella, St. Louis, MO (US); Grant Brewer, St. Louis, MO (US); Sanhong Zhang, Ballwin, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 815 days.

(21) Appl. No.: 17/479,661

(22) Filed: Sep. 20, 2021

(65) Prior Publication Data

US 2022/0093431 A1  Mar. 24, 2022

Related U.S. Application Data

(60) Provisional application No. 63/109,736, filed on Nov. 4, 2020, provisional application No. 63/080,238, filed on Sep. 18, 2020.

(51) Int. Cl.
  *G01N 25/18* (2006.01)
  *G01N 15/06* (2006.01)
  *H01L 21/67* (2006.01)

(52) U.S. Cl.
  CPC ....... *H01L 21/67253* (2013.01); *G01N 15/06* (2013.01); *G01N 15/0656* (2013.01);
  (Continued)

(58) Field of Classification Search
  CPC ......... H01L 21/67253; H01L 21/67017; H01L 21/67248; G01N 15/08; G01N 15/0656; G01N 25/18
  See application file for complete search history.

(56) References Cited

U.S. PATENT DOCUMENTS 3,229,499 A * 1/1966 Shayeson ............... G01N 25/50
                                                   73/53.07
4,138,878 A * 2/1979 Holmes .................. G01N 25/18
                                                   73/61.62
(Continued)

FOREIGN PATENT DOCUMENTS

CA       2863258 A1 *  8/2013  ............. G01F 1/684
CA       2892560 C  *  8/2018  ............ F28G 15/003
(Continued)

OTHER PUBLICATIONS

U.S. Appl. No. 17/479,661, filed May 20, 2024_CA_2892560_C_H.pdf, Aug. 21, 2018.*

(Continued)

*Primary Examiner* — Gail Kaplan Verbitsky
(74) *Attorney, Agent, or Firm* — Burris Law, PLLC

(57) ABSTRACT

A method of detecting accumulation of material deposits within a fluid flow conduit includes providing, by a controller, an excitation signal to a heating element of the fluid flow conduit. The method includes obtaining, by the controller, thermodynamic data of the fluid flow conduit in response to providing the excitation signal, where the thermodynamic data includes heat flux data, diffusivity data, time data, temperature differential data, or a combination thereof. The method includes determining, by the controller, an amount of material deposits based on the thermodynamic data.

24 Claims, 11 Drawing Sheets

(52) U.S. Cl.
CPC .. *H01L 21/67017* (2013.01); *H01L 21/67248* (2013.01); *G01N 25/18* (2013.01)

(56) References Cited

U.S. PATENT DOCUMENTS

| | | | |
|---|---|---|---|
| 4,383,438 A * | 5/1983 | Eaton | G01N 25/18 73/61.62 |
| 4,408,568 A * | 10/1983 | Wynnyckyj | F22B 37/56 122/379 |
| 4,929,896 A * | 5/1990 | Lara | G01B 7/06 324/71.2 |
| 5,248,198 A | 9/1993 | Droege | |
| 5,337,599 A * | 8/1994 | Hundere | G01N 33/2805 73/61.62 |
| 5,992,505 A | 11/1999 | Moon | |
| 6,499,876 B1 | 12/2002 | Baginski et al. | |
| 6,644,848 B1 * | 11/2003 | Clayton | E21B 43/01 73/61.62 |
| 6,886,393 B1 | 5/2005 | Romanet et al. | |
| 8,147,130 B2 | 4/2012 | Sakami et al. | |
| 8,360,635 B2 * | 1/2013 | Huang | G01N 33/2823 374/29 |
| 8,997,684 B2 | 4/2015 | Magni et al. | |
| 9,183,723 B2 * | 11/2015 | Sherman | F24F 11/526 |
| 9,909,480 B2 | 3/2018 | Mitchell et al. | |
| 10,317,262 B2 * | 6/2019 | Kippersund | G01N 29/22 |
| 10,760,742 B2 | 9/2020 | Rud et al. | |
| 11,953,458 B2 * | 4/2024 | Chattoraj | G01N 25/4873 |
| 2005/0105583 A1 | 5/2005 | Xiao et al. | |
| 2006/0048568 A1 * | 3/2006 | Korniyenko | G01F 1/692 73/204.22 |
| 2007/0181147 A1 | 8/2007 | Satake | |
| 2007/0189356 A1 | 8/2007 | Pettit et al. | |
| 2007/0221125 A1 | 9/2007 | Kaushal et al. | |
| 2008/0163700 A1 * | 7/2008 | Huang | G01B 17/025 73/861.25 |
| 2010/0225477 A1 | 9/2010 | Livchak et al. | |
| 2011/0286492 A1 | 11/2011 | Auret et al. | |
| 2011/0308548 A1 * | 12/2011 | Amundsen | G01B 21/085 374/7 |
| 2014/0177673 A1 | 6/2014 | Bliss et al. | |
| 2015/0268078 A1 | 9/2015 | Zhang et al. | |
| 2018/0073996 A1 | 3/2018 | Chattoraj et al. | |
| 2019/0390990 A1 | 12/2019 | Krywyj et al. | |

FOREIGN PATENT DOCUMENTS

| | | | | |
|---|---|---|---|---|
| CA | 3054141 A1 | * | 8/2018 | ............. A61M 5/14 |
| CH | 696042 A5 | * | 11/2006 | ............. G01N 25/18 |
| CN | 109690246 A | | 4/2019 | |
| CN | 113509203 A | * | 10/2021 | ........... A61B 5/7267 |
| EP | 3067671 A1 | | 9/2016 | |
| FR | 2799261 A1 | * | 4/2001 | ............... F17D 3/01 |
| GB | 1403950 | | 8/1975 | |
| JP | 2007040739 A | | 2/2007 | |
| KR | 20050102802 A | * | 10/2005 | |
| RU | 2439491 C1 | * | 1/2012 | |
| TW | 201430340 A | | 8/2014 | |
| TW | 201538775 A | | 10/2015 | |
| TW | 202012685 A | | 4/2020 | |
| WO | 2016110696 A1 | | 7/2016 | |
| WO | 2019167166 | | 9/2019 | |
| WO | WO-2021003140 A1 | * | 1/2021 | ............. A61B 5/015 |

OTHER PUBLICATIONS

U.S. Appl. No. 17/479,661, filed May 23, 2024_CH_696042_A5_H.pdf,Nov. 30, 2006.*
U.S. Appl. No. 17/479,661, filed May 23, 2024_CN_113509203_A_H.pdf,Oct. 19, 2021.*
U.S. Appl. No. 17/479,661, filed May 23, 2024_KR_20050102802_A_H.pdf,Oct. 27, 2005.*
U.S. Appl. No. 17/479,661, filed May 23, 2024_RU_2439491_C1_H.pdf,Jan. 10, 2012.*
U.S. Appl. No. 17/479,661, filed Oct. 1, 2024_CA_2863258_A1_H.pdf,Aug. 8, 2013.*
U.S. Appl. No. 17/479,661, filed Oct. 1, 2024_FR_2799261_A1_H.pdf,Apr. 6, 2001.*
U.S. Appl. No. 17/479,661, filed Oct. 10, 2024_WO_2021003140_A1_H.pdf,Jan. 7, 2021.*
U.S. Appl. No. 17/479,661, filed Feb. 13, 2025_CA_3054141_A1_H.pdf,Aug. 30, 2018.*
Search Report issued in corresponding TW Application No. 110135185, dated Aug. 17, 2022, 1 page.
Search Report issued in corresponding TW Application No. 110135185, dated Apr. 29, 2022, 1 page.
International Search Report for International Application PCT/US2021/051089, mailed Dec. 23, 2021.

* cited by examiner

SYSTEMS AND METHODS FOR DETECTING THE PRESENCE OF DEPOSITS IN FLUID FLOW CONDUITS

CROSS-REFERENCE TO RELATED APPLICATIONS

This application claims priority to and the benefit of U.S. Provisional Application No. 63/080,238 filed on Sep. 18, 2020, and U.S. Provisional Application No. 63/109,736 filed on Nov. 4, 2020. The disclosures of the above applications are incorporated herein by reference.

FIELD

The present disclosure relates to fluid flow conduits, and more specifically, to systems and methods for detecting the build-up of deposits in fluid flow conduits.

BACKGROUND

The statements in this section merely provide background information related to the present disclosure and may not constitute prior art.

A semiconductor processing system may include a processing chamber and a plurality of fluid flow conduits through which processing gases are supplied into and removed from the processing chamber. Over time, material may accumulate within the plurality of fluid flow conduits. Excessive material build-up can inhibit fluid flow and cause clogs and/or system issues.

To monitor material build-up within a fluid flow conduit, one or more scopes or cameras may be inserted within the fluid flow conduit. However, the geometry of the fluid flow conduit and/or the geometry of the material build-up may inhibit the one or more scopes/cameras from accurately detecting the severity and location of material build-up. Further, placing a scope or camera within the fluid flow conduit may be prohibited due to potential contamination issues.

These issues related to monitoring material build-up within a fluid flow conduit are addressed by the present disclosure.

SUMMARY

This section provides a general summary of the disclosure and is not a comprehensive disclosure of its full scope or all of its features.

The present disclosure provides a method of detecting accumulation of material deposits within a fluid flow conduit includes providing, by a controller, an excitation signal to a heating element of the fluid flow conduit. The method includes obtaining, by the controller, thermodynamic data of the fluid flow conduit in response to providing the excitation signal, where the thermodynamic data includes heat flux data, diffusivity data, time data, temperature differential data, or a combination thereof. The method includes determining, by the controller, an amount of material deposits based on the thermodynamic data.

In one form, the thermodynamic data includes the heat flux data, and the method further comprises determining an aperture size of the fluid flow conduit based on the heat flux data, where the amount of material deposits is further based on the aperture size. In one form, the excitation signal has a predetermined pulse length, the thermodynamic data includes the diffusivity data, and the diffusivity data indicates a measured thermal diffusivity as a function of the predetermined pulse length. In one form, the method further includes providing the excitation signal to the heating element of the fluid flow conduit reach a first setpoint temperature, where the thermodynamic data includes the time data, where the time data indicates an amount of time to have the temperature of the fluid flow conduit reach a second setpoint temperature, and where the second setpoint temperature is less than the first setpoint temperature. In one form, the method further includes obtaining a temperature of the fluid flow conduit in response to providing the excitation signal, where the excitation signal has a predetermined electrical power and a setpoint temperature of the fluid flow conduit associated with the predetermined electrical power, where the thermodynamic data includes the temperature differential data, and where the temperature differential data indicates a temperature difference between the temperature and the setpoint temperature. In one form, the temperature and the setpoint temperature are associated with a predetermined location of the fluid flow conduit.

In one form, the method further includes providing the excitation signal to a second heating element of the fluid flow conduit, where the excitation signal has a predetermined electrical power, the heating element is provided proximate to a first location of the fluid flow conduit, and the second heating element is provided proximate to a second location of the fluid flow conduit. In one form, the method further includes obtaining a first temperature and a second temperature of the fluid flow conduit in response to providing the excitation signal, where the first temperature is associated with the first location, and the second temperature is associated with the second location, where the thermodynamic data includes the temperature differential data, and where the temperature differential data indicates a temperature difference between the first temperature and the second temperature. In one form, the method further includes determining the amount of material deposits based on a fluid flow rate of the fluid flow conduit. In one form, the method further includes generating an alert in response to the amount of material deposits exceeding a threshold value. In one form, the heating element is integrated with the fluid flow conduit. In one form, the heating element is disposed on an exterior surface of the fluid flow conduit.

The present disclosure provides a method of detecting accumulation of material deposits within a fluid flow conduit including providing, by a controller, an excitation signal to a heating element of the fluid flow conduit. The method includes obtaining, by the controller, electrical data of the heating element in response to providing the excitation signal, where the electrical data indicates a voltage, an electric current, or a combination thereof. The method includes determining, by the controller, an amount of material deposits based on the electrical data. In one form, the electrical data indicates a power consumption of the heating element when the excitation signal has a predetermined electrical power. In one form, the method further includes determining the amount of material deposits based on a fluid flow rate of the fluid flow conduit. In one form, the method further includes generating an alert in response to the amount of material deposits exceeding a threshold value. In one form, the heating element is integrated with the fluid flow conduit. In one form, the heating element is disposed on an exterior surface of the fluid flow conduit.

The present disclosure provides a system for detecting accumulation of material deposits within a fluid flow conduit including a processor and a nontransitory computer-readable medium comprising instructions that are executable by the processor. The instructions include providing an excitation signal to a heating element of the fluid flow conduit. The instructions include obtaining thermodynamic data of the fluid flow conduit in response to providing the excitation signal, where the thermodynamic data includes heat flux data, diffusivity data, time data, temperature differential data, or a combination thereof. The instructions include determining an amount of material deposits based on the thermodynamic data.

In one form, the thermodynamic data includes the heat flux data, and the instructions further include determining an aperture size of the fluid flow conduit based on the heat flux data, where the amount of material deposits is further based on the aperture size. In one form, the excitation signal has a predetermined pulse length, the thermodynamic data includes the diffusivity data, and the diffusivity data indicates a measured thermal diffusivity as a function of the predetermined pulse length. In one form, the instructions further include providing the excitation signal to the heating element to have a temperature of the fluid flow conduit reach a first setpoint temperature, where the thermodynamic data includes the time data, where the time data indicates an amount of time to have the temperature of the fluid flow conduit reach a second setpoint temperature, and where the second setpoint temperature is less than the first setpoint temperature. In one form, the instructions further include obtaining a temperature of the fluid flow conduit in response to providing the excitation signal, where the excitation signal has a predetermined electrical power and a setpoint temperature of the fluid flow conduit associated with the predetermined electrical power, where the thermodynamic data includes the temperature differential data, and where the temperature differential data indicates a temperature difference between the temperature and the setpoint temperature. In one form, the temperature and the setpoint temperature are associated with a predetermined location of the fluid flow conduit.

In one form, the instructions further include providing the excitation signal to a second heating element of the fluid flow conduit, where the excitation signal has a predetermined electrical power, the heating element is provided proximate to a first location of the fluid flow conduit, and the second heating element is provided proximate to a second location of the fluid flow conduit. In one form, the instructions further include obtaining a first temperature and a second temperature of the fluid flow conduit in response to providing the excitation signal, where the first temperature is associated with the first location, and the second temperature is associated with the second location, where the thermodynamic data includes the temperature differential data, and where the temperature differential data indicates a temperature difference between the first temperature and the second temperature.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1A:
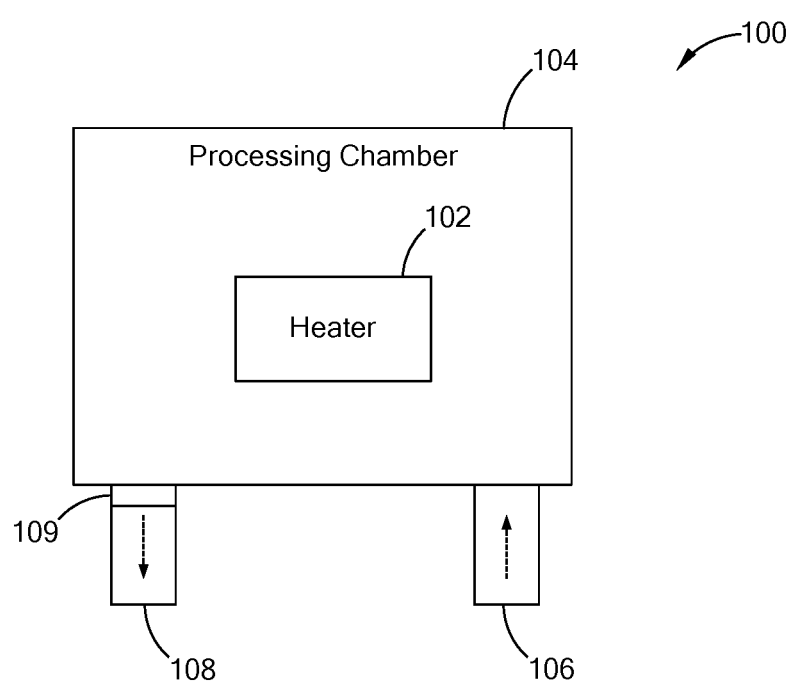
FIG. 1A is a block diagram of a processing chamber of a semiconductor processing system having a fluid flow system according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure relates to a monitoring system configured to monitor material build-up in a fluid flow system. The monitoring system obtains various operational data of the fluid flow system, such as thermodynamic data or electrical data, and the monitoring system determines an amount and/or location of material build-up in one or more fluid flow conduits of the fluid flow system based on the operational data. By determining the amount and/or location of material build-up in the one or more fluid flow conduits based on the operational data, the monitoring system can accurately monitor the fluid flow system for build-up and potential clogs.

Figure 1B:
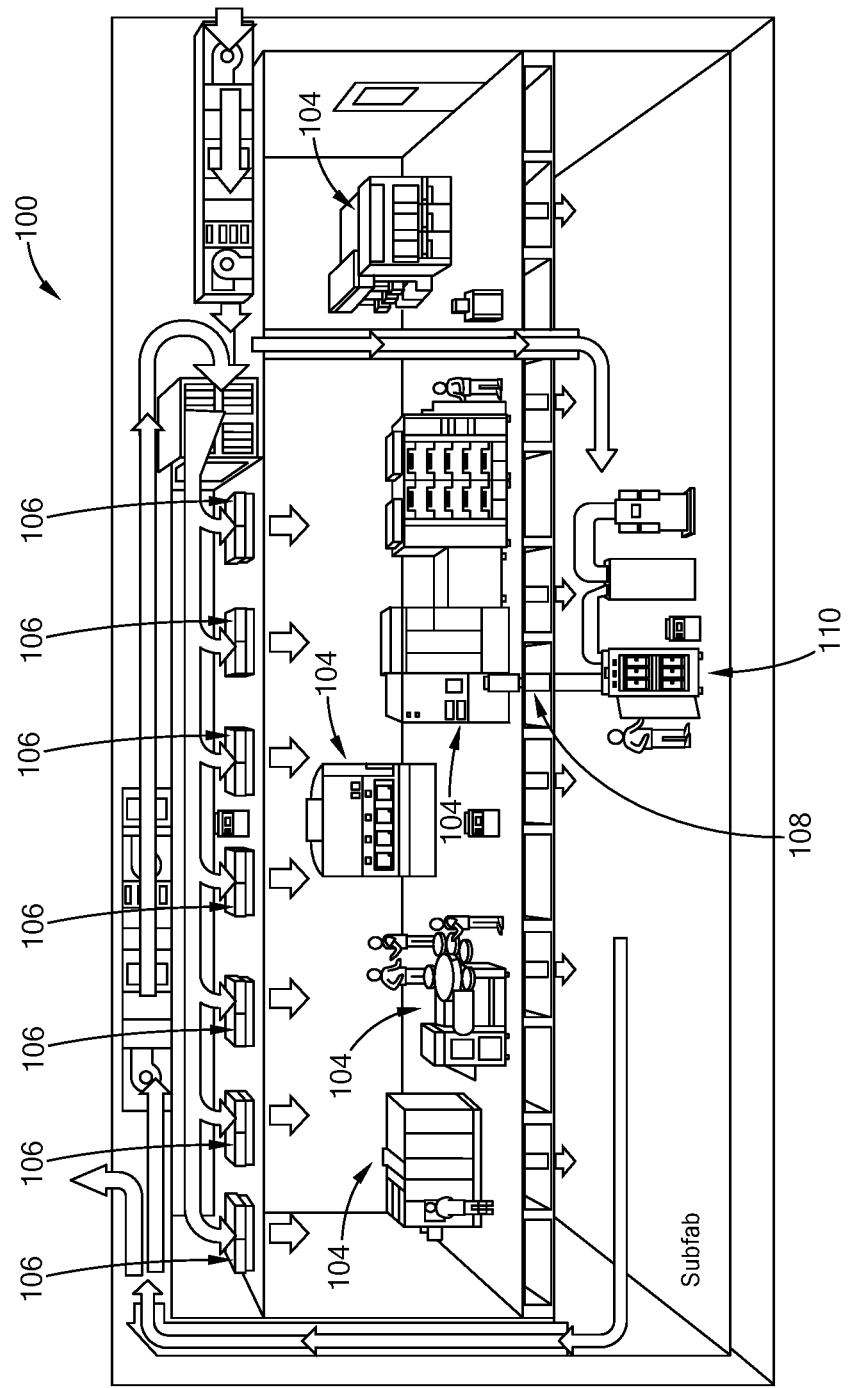
FIG. 1B illustrates a semiconductor processing system having a fluid flow system according to the present disclosure.

In an example application, the monitoring system of the present disclosure is employed in a semiconductor processing system for monitoring build-up in a fluid flow system of an abatement system of the semiconductor processing system. More particularly, referring to FIGS. 1A-1B, a semiconductor processing system 100 includes a heater 102 for heating semiconductor wafers, a processing chamber 104, fluid flow supply lines (FFSLs) 106, fluid flow exhaust lines (FFELs) 108, and pump(s) 109. In operation, processing fluids (e.g., gases such as ammonia, silane, argon, arsine, and/or phosphine, among other gases) are supplied into the processing chamber 104 through the FFSLs 106 during various stages of the semiconductor fabrication process. The processing fluid is removed from the processing chamber 104 through the FFELs 108 and the pump 109, and the processing fluid may be referred to as exhaust fluid. The pump(s) 109 may be any configuration of a vacuum pump system, such as a residual gas analyzer (RGA) system. The FFELs 108 can be set to an open condition or a choked condition by operating the bypass valves to fluidly couple the FFELs 108 with one of the open channels and the blocked channel of the bypass valves. The FFELs 108 define a fluid flow system having a series of conduits for carrying the exhaust fluid to an abatement device 110, where the exhaust fluid is cleansed and neutralized.

As used herein, the term "fluid" should be construed to mean solid, liquid, gas, or plasma. Further, although a semiconductor processing system 100 is illustrated and described, it should be understood that the teachings of the present disclosure can be used in other applications such as, by way of example, injection molding, exhaust aftertreatment systems, and oil/gas energy processes, among others while remaining within the scope of the present disclosure.

Fluid flowing through the FFELs 108 is typically heated to inhibit contaminants in the exhaust fluid from depositing along the walls of the FFELs 108 and thus, clogging the FFELs 108. In one form, multiple flexible heaters wrap about the FFELs 108 to heat the fluid therein. In another example, cartridge heaters are disposed to directly heat fluid flowing through the FFELs 108 or provided within a container.

Figure 2A:
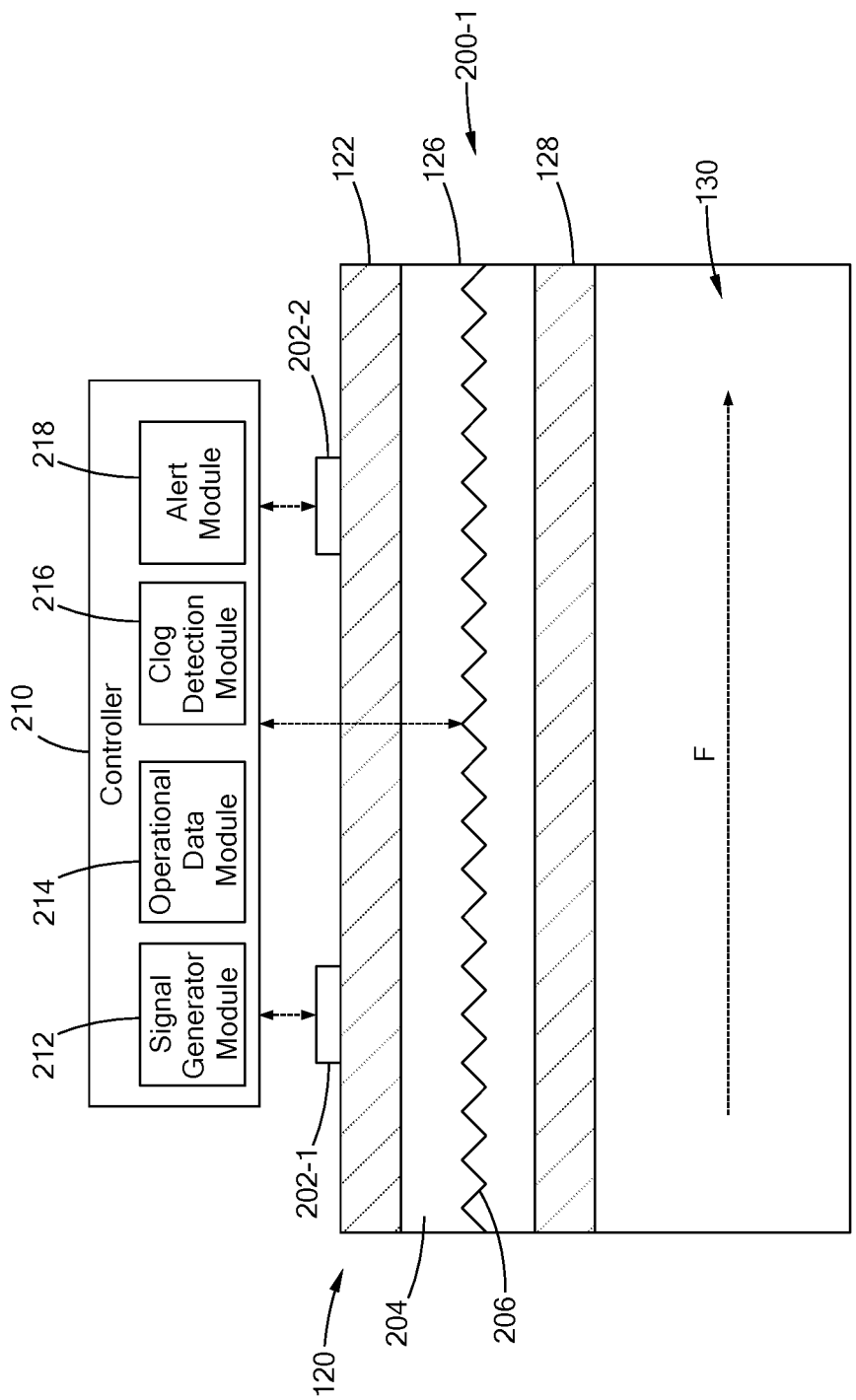
FIG. 2A is a cross-sectional view of a conduit of a fluid flow system according to the present disclosure.

Referring to FIG. 2A, a monitoring system 200-1 is provided within a conduit 120 of the FFELs 108 to monitor build-up of deposits within the conduit 120. In one form, the conduit 120 includes an outer layer 122, a monitoring layer 126 having one or more components of the monitoring system 200-1, an inner layer 128, and a cavity 130. The outer layer 122 is adjacent to the monitoring layer 126. The monitoring layer 126 is adjacent to the inner layer 128, and the inner layer 128 is adjacent to the cavity 130. The layers of the conduit 120 are bonded and/or fixed to each other using various processes and/or materials, such as a soldering process, a brazing process, an adhesive, or any other suitable process/material.

The outer layer 122 is a protective layer and is constructed of a durable and thermally insulating material that reduces or inhibits heat loss to an outside environment from the exhaust fluid flowing through the conduit 120, such as, by way of example, a fiberglass material. The inner layer 128 includes any thermally conductive material, such as a metal, and defines an inner wall of the cavity 130 that the exhaust fluid flows through, as indicated by arrow (F) in FIG. 2A.

In one form, the monitoring system 200-1 includes multiple sensors 202-1, 202-2 (collectively referred to as "sensors 202"), an insulation material 204, a heating element 206, and a controller 210. The insulation material 204 is disposed within the monitoring layer 126 of the conduit 120. Furthermore, the heating element 206 in this form is disposed within the monitoring layer 126 of the conduit 120 (i.e., the heating element 206 is integrated with the conduit 120). In one form, the sensors 202 are disposed on the outer layer 122 of the conduit 120. It should be understood that any one of the sensors 202 can be disposed within the conduit 120 (e.g., within the insulation material 204), in other forms. While two sensors 202 are shown, it should be understood that the monitoring system 200-1 may include any number of sensors 202 in other forms.

In one form, the sensors 202 are disposed at locations along the conduit 120 and/or semiconductor processing system 100 that are susceptible to accumulation of material build-up due to, for example, the geometry of the conduit 120 and/or thermal properties of the semiconductor processing system 100 (e.g., heatsinks/cold traps of the semiconductor processing system 100). As an example, the sensors 202 are disposed near and/or adjacent to flanges, clamps, struts valves, among other locations in which the material build-up accumulates. In one form, a pair of sensors 202 (e.g., the first sensor 202-1 and the second sensor 202-2) are disposed at predefined distances from the areas that are susceptible to accumulation of material build-up. As an example, in one form, the first sensor 202-1 is positioned one inch from a predicted material build-up location, and the second sensor 202-2 is positioned twenty inches from the predicted material build-up location. It should be understood that the pair of sensors 202 can be positioned at any distance from the predicted material build-up location and is not limited to the examples described herein.

In one form, each of the sensors 202 is implemented by a plurality of thermocouples that collectively form a heat flux sensor or other similar electronic devices configured to generate data indicative of the heat flux (i.e., heat flux data) within the conduit 120. In another form, each of the sensors 202 is implemented by any temperature sensor device configured to generate data indicative of the temperature at a corresponding location of the conduit 120. The insulating material 204 is implemented by one or more materials having sufficient dielectric characteristics that enable the sensors 202 to measure the rate at which the temperature changes when the heating element 206 emits heat (e.g., a rubber silicone material). The heating element 206 is implemented by any material configured to emit heat in response to receiving an excitation signal, such as an electrically resistive material (e.g., copper, nickel, silver, aluminum, lithium, platinum, tin, a combination thereof, among others).

Figure 2B:
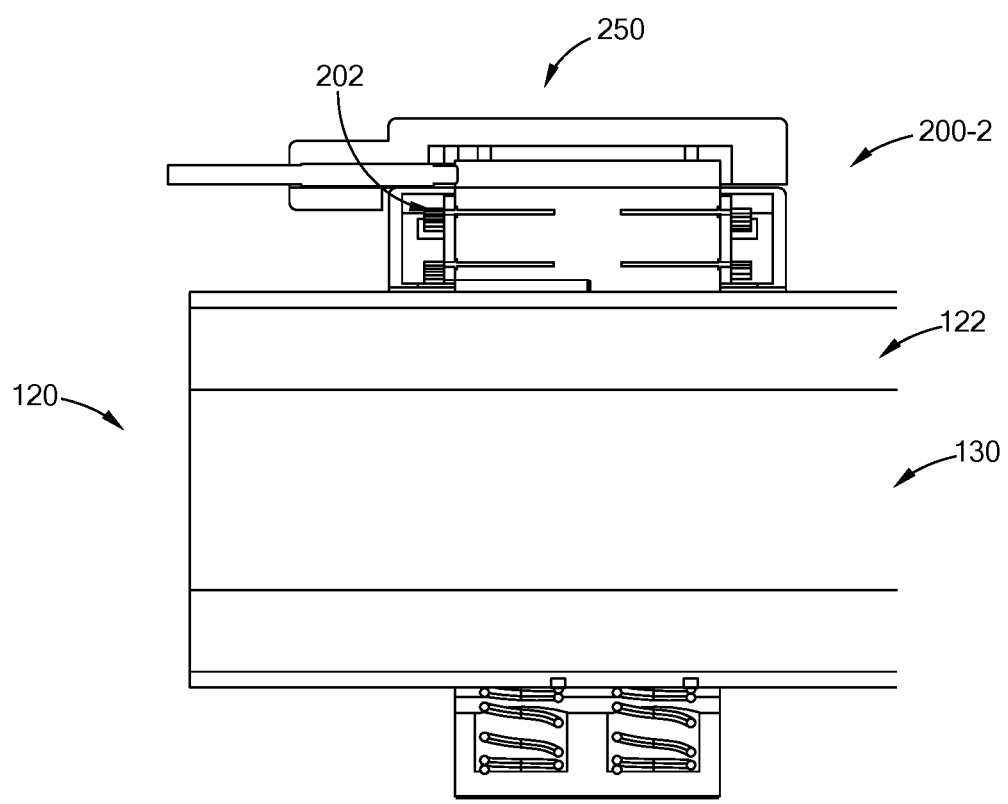
FIG. 2B is another cross-sectional view of a conduit of a fluid flow system according to the present disclosure.

In lieu of having the monitoring system 200-1 integrated with the conduit 120, the monitoring system 200-1 and, more particularly, the sensor(s) 202 and/or the heating element 206 are disposed outside of the conduit 120 (i.e., on an exterior surface of the conduit 120, such as the outer layer 122). For example, with reference to FIG. 2B, the conduit 120 is equipped with a monitoring system 200-2 having a fluid flow sensor assembly 250 and the controller 210 (not shown in FIG. 2B) to monitor material build-up in the conduit 120. In one form, the fluid flow sensor assembly 250 is disposed at the outer layer 122 of the conduit 120 and is bonded to the outer layer 122 using a soldering process, a brazing process, an adhesive, or other suitable process/material. The fluid flow sensor assembly 250 includes one or more sensors 202, such as a thermocouple, to obtain data representing the temperature/heat flux of the conduit 120. Additional examples of fluid flow sensor assemblies to be used with the monitoring system of the present disclosure are described in U.S. Patent Application Publication No. 2022/0090951 titled DEVICES FOR DETECTING MATERIAL DEPOSITS IN FLUID FLOW CONDUITS, which is commonly owned with the present application and the contents of which are incorporated herein by reference in its entirety.

Referring back to FIG. 2A, the sensors 202 and the heating element 206 are communicatively and/or electrically coupled to the controller 210. As an example, the sensors 202 are communicatively coupled to the controller 210 via a hardwire communication link or a wireless communication link, such as a Bluetooth-type link (e.g., a Bluetooth low energy link), a wireless fidelity (Wi-Fi) link, a near field communication (NFC) link, among others. As another example, the heating element 206 is electrically coupled to the controller 210 via an electrical cable (not shown).

The controller 210 includes a signal generator module 212, an operational data module 214, a clog detection module 216, and an alert module 218. In order to perform the functionality described herein, the controller 210 is implemented by a microcontroller that includes one or more processor circuits configured to execute machine-readable instructions stored in one or more nontransitory computer-readable mediums, such as a random-access memory (RAM) circuit and/or a read-only memory (ROM) circuit. While the signal generator module 212, the operational data module 214, the clog detection module 216, and the alert module 218 are illustrated as part of the controller 210, it should be understood that any one of these modules may be located on separate controller(s) communicably coupled to the controller 210.

The signal generator module 212 is configured to provide an excitation signal to the heating element 206 to have the heating element 206 generate heat. More particularly, in one form, the excitation signal is provided as a pulse width modulation (PWM) signal having a predefined amplitude, where the amplitude indicates at least one of a voltage magnitude, a current magnitude, and/or a power magnitude of the PWM signal. In another form, the excitation signal is provided as a PWM signal having a predefined pulse width, such as 210 milliseconds to 1 second, including endpoints. In one form, the signal generator module 212 provides the excitation signal as a pulse having a predefined amplitude and over a predefined period of time (e.g., 12 minutes) such that a temperature of the conduit 120 is heated to a target temperature (e.g., 25° C.-40° C. above a setpoint temperature of the conduit 120, including endpoints). Accordingly, the sensors 202 can provide operational data at a given resolution for accurate processing by the operational data module 214, as described below in further detail.

The operational data module 214 is configured to obtain operational data regarding the semiconductor process, such as thermodynamic data and/or electrical data. Example thermodynamic data includes, but is not limited to, heat flux data, diffusivity data, time data, and temperature differential data. As used herein, "heat flux data" is data provided by the sensors 202 that represent the heat flux of the conduit 120. As used herein, "diffusivity data" refers to a rate of heat transfer of and/or between various components of the FFELs 108. As used herein, "time data" refers to data representing an amount of time necessary to cool down an outer layer of the FFELs 108 once heated above a setpoint temperature. As used herein, "temperature differential data" refers to data representing a temperature difference between at least two locations of a respective FFEL 108 or data representing a temperature difference at a same location of a respective FFEL 108 taken at different times.

As used herein, "electrical data" refers to the electrical characteristics of the excitation signal provided by the signal generator module 212. Accordingly, the electrical characteristics may include voltage, current, and/or power of the excitation signal and/or a power consumption of the heating element 206 when the excitation signal has a predetermined electrical power.

In some forms, the operational data module 214 is configured to obtain other types of operational data regarding the semiconductor process, such as system level data. As used herein, "system level data" refers to data representing at least one of ambient temperature data of the semiconductor processing system 100, material properties of the components of the semiconductor processing system 100, a composition of the fluid of the semiconductor processing system 100, mass flow rates of the semiconductor processing system 100, and/or other parameters of the semiconductor processing system 100.

In one form, the operational data module 214 is configured to obtain the operational data in response to the signal generator module 212 providing the excitation signal (i.e., the monitoring system 200-1 has an active material build-up detection configuration). In another form, the operational data module 214 can obtain the one or more operational characteristics of the conduit 120 without the excitation signal (i.e., the monitoring system 200-1 has a passive material build-up detection configuration). Accordingly, the signal generator module 214 may be removed from the controller 210 when the monitoring system 200-1 has the passive material build-up detection configuration.

The clog detection module 216 is configured to monitor material build-up based on the operational data and determine whether the FFELs 108 is clogged. For example, the clog detection module 216 determines the amount of material build-up at the conduit 120 based on defined mathematical correlations that correlates the operational data to material build-up. Based on the material build-up, the alert module 218 is configured to generate an alert in response to the material build-up exceeding one or more thresholds indicating restricted flow and/or a clogged condition of the FFELs 108. In addition to or in lieu of defined alerts, the alert module 218 may provide a system user interface to provide information related to the material build-up, thereby allowing a user, such as an engineer or technician, to continuously monitor material build-up at the conduit 120 having the monitoring system 200.

Figure 3:
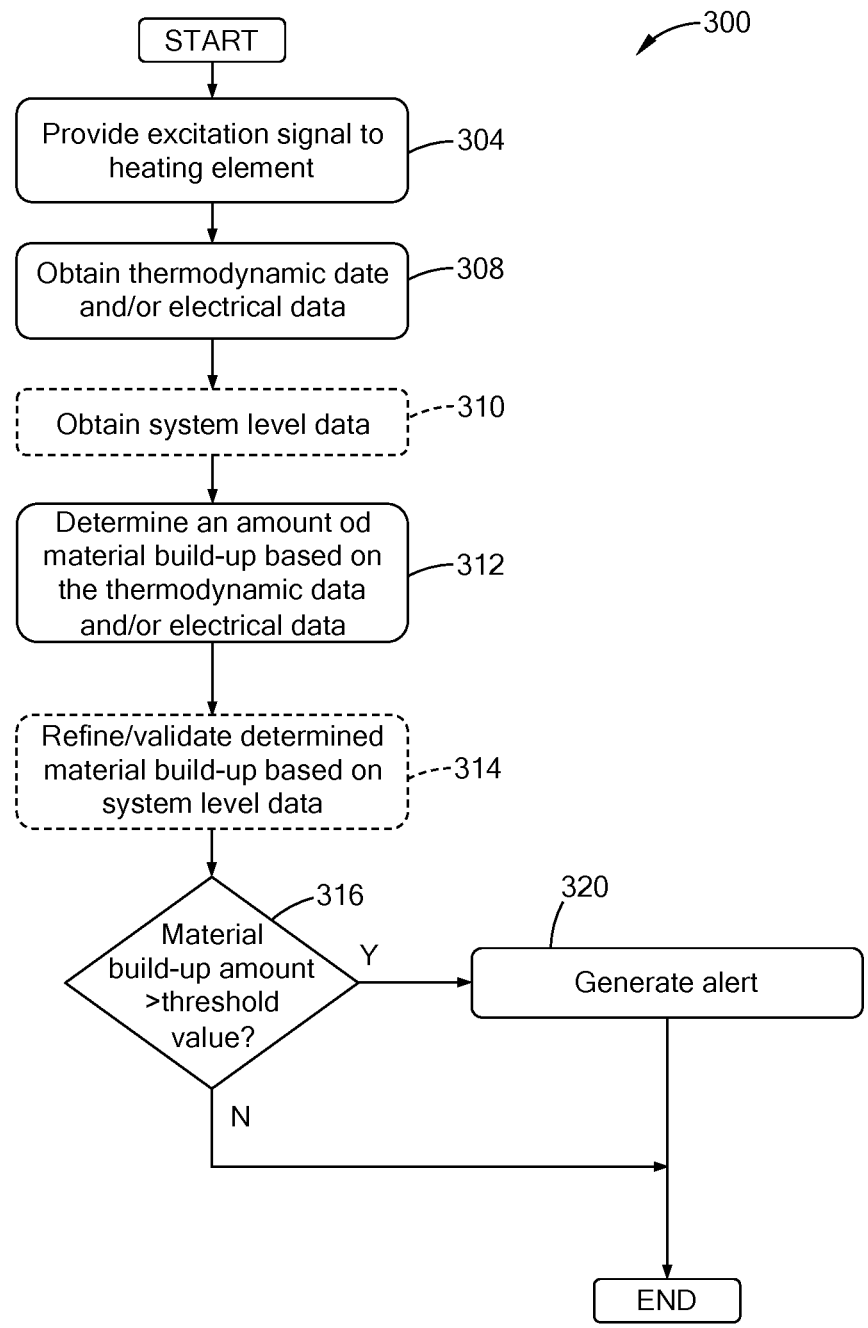
FIG. 3 is a flowchart for determining material build-up within the fluid flow system according to the present disclosure.

Referring to FIG. 3, a flowchart illustrating an example routine 300 for determining or monitoring material build-up in the conduit 120. At 304, the controller 210 provides an excitation signal to the heating element 206 of the conduit 120. At 308, the controller 210 obtains thermodynamic data of the conduit 120 and/or electrical data of the heating element 206 in response to providing the excitation signal. Optionally, at 310, the controller obtains the system level data of the semiconductor processing system 100 at 308. While the routine 300 illustrates the controller 210 obtaining the one or more operational characteristics of the conduit 120 in response to providing the excitation signal, it should be understood that, in another form, the controller 210 can obtain the one or more operational characteristics of the conduit 120 without the excitation signal (i.e., monitoring system 200, which collectively or individually refers to one of monitoring systems 200-1, 200-2, has a passive material build-up detection configuration).

At 312, the controller 210 determines an amount of material build-up based on the thermodynamic data and/or the electrical data.

Figure 4:
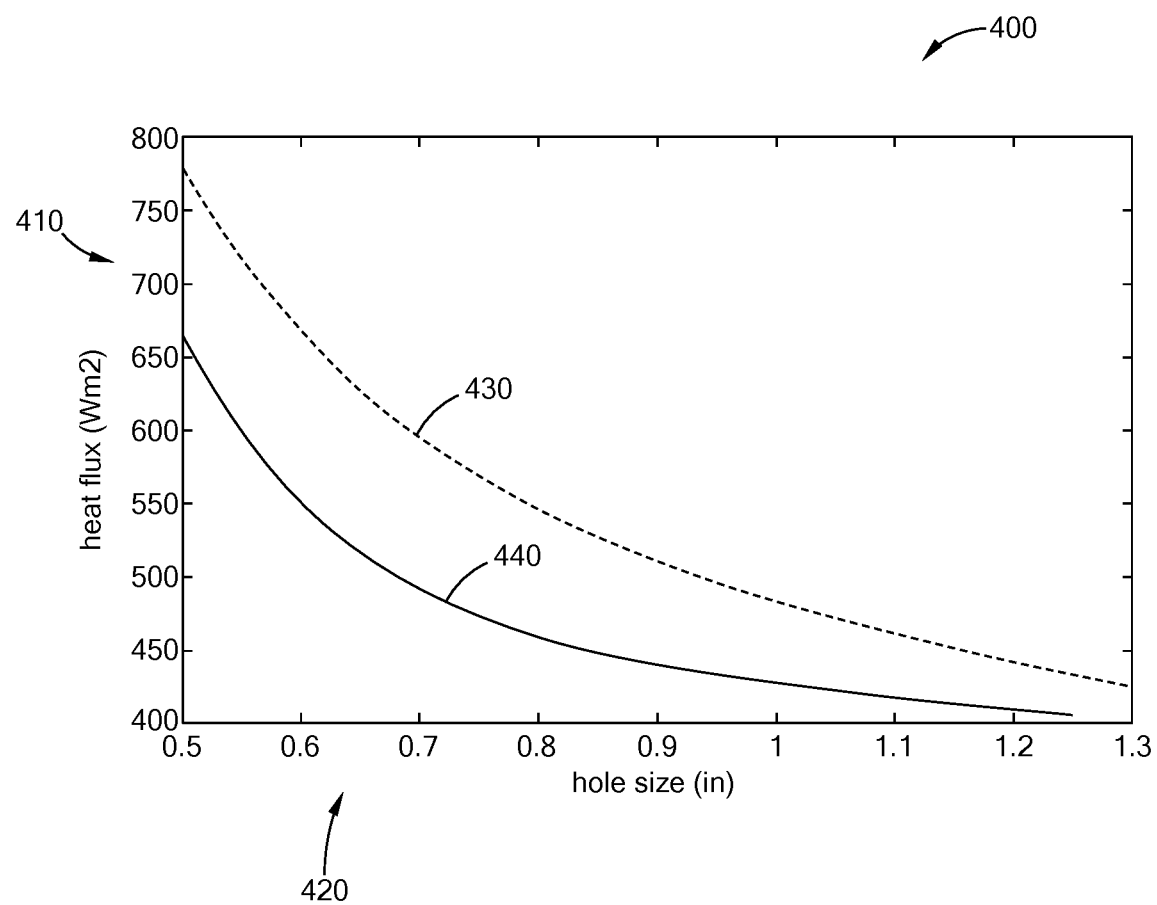
FIG. 4 is a graph illustrating the relationship between heat flux data and material build-up according to the present disclosure.

In one form, determining the amount of material build-up based on the thermodynamic data is further based on physical equations, mathematical models, and/or principles of heat transfer. As an example of step 312, the controller 210 may correlate heat flux data with the aperture/hole size of the conduit. Specifically, FIG. 4 illustrates a graph 400 of heat-flux measurements (y-axis 410) versus aperture/hole size of the conduit 120 (x-axis 420). In the graph, plot 430 is heat-flux measurements based on data from the first sensor 202-1, and plot 440 is heat-flux measurements based on data from the second sensor 202-2. As shown, the higher the heat flux measurement, the smaller the aperture size and, thus, the more build-up within the conduit 120. Accordingly, the controller 210 may determine the amount of material build-up within the conduit 120 based on the heat flux data and the corresponding aperture size.

Figure 5:
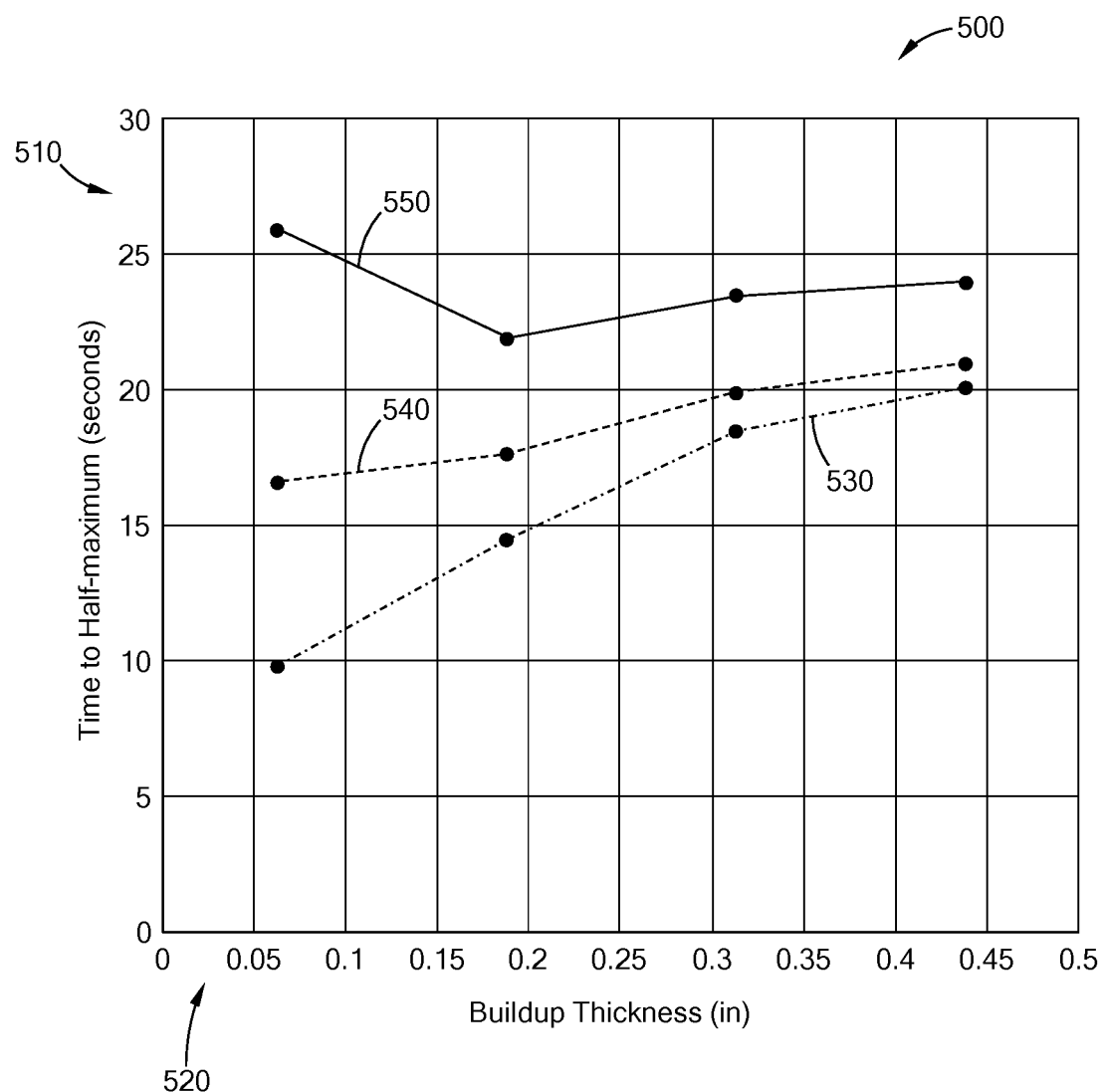
FIG. 5 is a graph illustrating the relationship between time data and material build-up according to the present disclosure.

In another example, at step 312, the controller 210 correlates the amount of time it takes to cool the conduit 120 (i.e., the time data) to material build-up. Specifically, FIG. 5 illustrates a graph 500 that depicts a relationship between the amount of time needed to cool down the outer layer 122 of the conduit 120 to half of the maximum temperature once it is heated above a setpoint temperature (i.e., the time data is shown on the y-axis 510) to the amount of material build-up (i.e., build-up thickness shown on the x-axis 520). In one form, the setpoint temperature is set between 180° C. and 200° C., including endpoints. Plot 530 represents an excitation signal having a pulse width of 1 second, plot 540 represents an excitation signal having a pulse width of 500 milliseconds, and plot 550 represents an excitation signal having a pulse width of 250 milliseconds. As shown by plots 530, 540, 550, the larger or thicker the material build-up, the more time it takes to cool down the outer layer 122 of the conduit 120 to half of the maximum temperature once it is heated above the setpoint temperature. Accordingly, the controller 210 may determine the amount of material build-up within the conduit 120 based on the time data.

Figure 6:
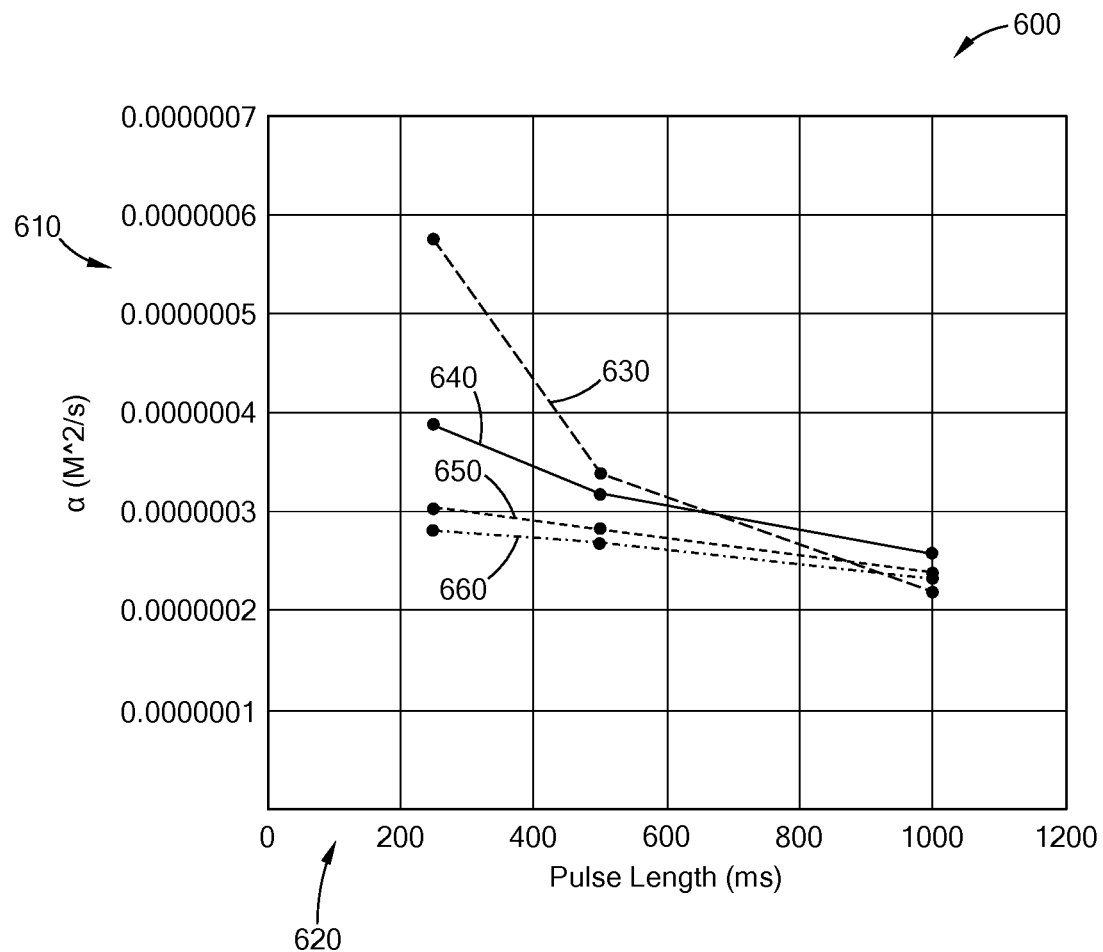
FIG. 6 is a graph illustrating the relationship between diffusivity data and material build-up according to the present disclosure.

In yet another example, for step 312, the controller 210 correlates thermal diffusivity data and a predetermined pulse length with material build-up. Specifically, FIG. 6 illustrates a graph 600 that provides thermal diffusivity data (y-axis 610) versus the pulse length (the x-axis 620) for various material build-up values. For example, plot 630 represents the conduit 120 having a first material build-up amount ($MB_1$), plot 640 represents the conduit 120 having a second material build-up amount ($MB_2$), plot 650 represents the conduit 120 having a third material build-up amount ($MB_3$), and plot 660 represents the conduit 120 having a fourth material build-up amount ($MB_4$), where $MB_1 < MB_2 < MB_3 < MB_4$. As shown by plots 630, 640, 650, 660, higher amounts of thermal diffusivity correlate to lower amounts of material build-up. Accordingly, the controller 210 may determine the amount of material build-up within the conduit 120 based on the thermal diffusivity data and as a function of the predetermined pulse length.

Figure 7:
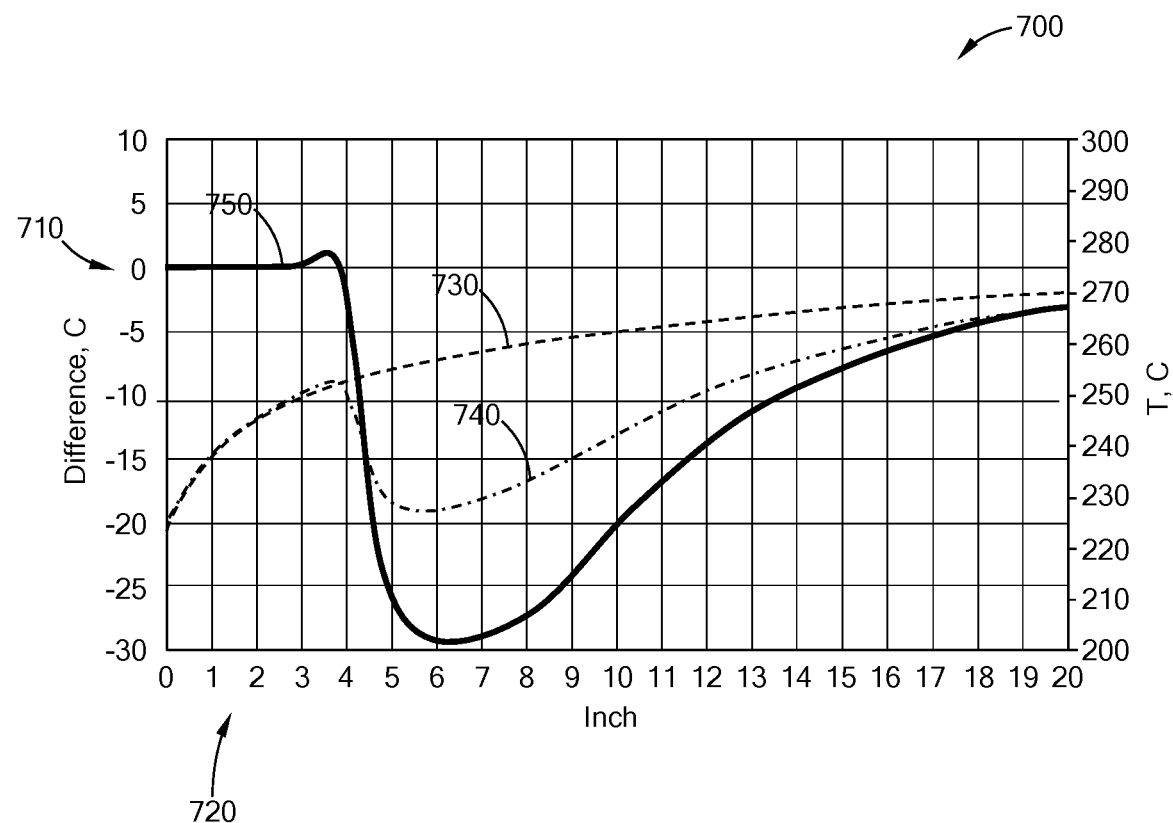
FIG. 7 is a graph illustrating the relationship between temperature differential data and material build-up according to the present disclosure.

In another example, for step 312, the controller 210 correlates temperature differential data with a longitudinal location along the conduit 120 to determine material build-up. Specifically, FIG. 7 illustrates a graph 700 that illustrates a relationship between temperature differential data (y-axis 710) to a longitudinal location along the conduit 120 (x-axis 720). For a given fluid flow rate and given heater power (e.g., the excitation signal has a predetermined electrical power that causes the conduit 120 to reach a given setpoint temperature when there is no material build-up in the conduit 120), the controller 210 determines the amount of material build-up in the conduit 120, as illustrated by plots 730, 740, 750. Plot 730 represents a setpoint temperature of a location associated with one of the sensors 202 when there is no material build-up, plot 740 represents the actual temperature of a location associated with one of the sensors 202 when there is at least some material build-up, and plot 750 represents the temperature differential between the setpoint temperature and the actual temperature. Accordingly, the controller 210 may determine the amount of material build-up within the conduit 120 based on the temperature differential data.

In some variations, the controller 210 may correlate the temperature differential data as indicated by the heat flux data at a plurality of locations along the pipe (e.g., heat flux data based on data from the first and second sensors 202-1, 202-2). As an example, a first sensor 202-1 is disposed at a first location within the conduit 120 and a second sensor 202-2 is disposed at a second location within the conduit 120. The controller 210 may determine the amount of material build-up adjacent to or between the first location and the second location based on the temperature difference of the first location and the second location. As an example, larger temperature differences may correspond to larger amounts of material build-up within the conduit 120. Accordingly, the controller 210 may determine the amount of material build-up within the conduit 120 based on the temperature differential data and the corresponding amount of material build-up.

Figure 8:
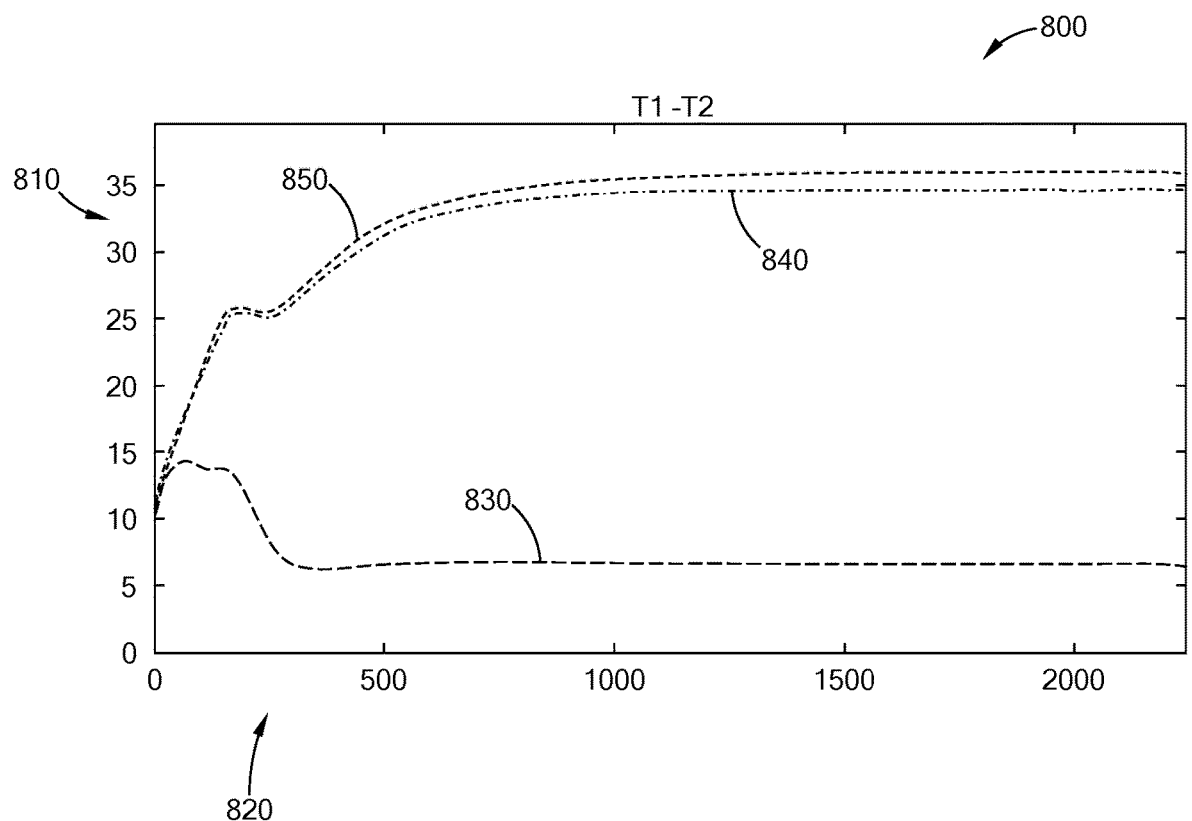
FIG. 8 is a graph illustrating the relationship between steady-state temperature differential data and material build-up according to the present disclosure.

In yet another example, at step 312, the controller 210 correlates the temperature differential data with temperature to determine material build-up. Specifically, FIG. 8 illustrates a graph 800 that correlates temperature differential data (y-axis 810) with the amount of time (x-axis 820). The controller 210 may determine, for a given fluid flow rate and given heater power (e.g., the excitation signal has a predetermined electrical power), the steady state temperature differential data of the conduit 120 for varying levels of material build-up, as illustrated by plots 830, 840, 850. Plot 830 represents a temperature difference between two or more sensors 202 when there is no material build-up, plot 840 represents a temperature difference between two or more sensors 202 when the conduit 120 has a first material build-up amount ($MB_1$), and plot 850 represents a temperature difference between two or more sensors 202 when the conduit 120 has a second material build-up amount ($MB_2$), where the $MB_1 < MB_2$. Accordingly, the controller 210 may determine the amount of material build-up within the conduit 120 based on the steady state temperature differential data.

Figure 9:
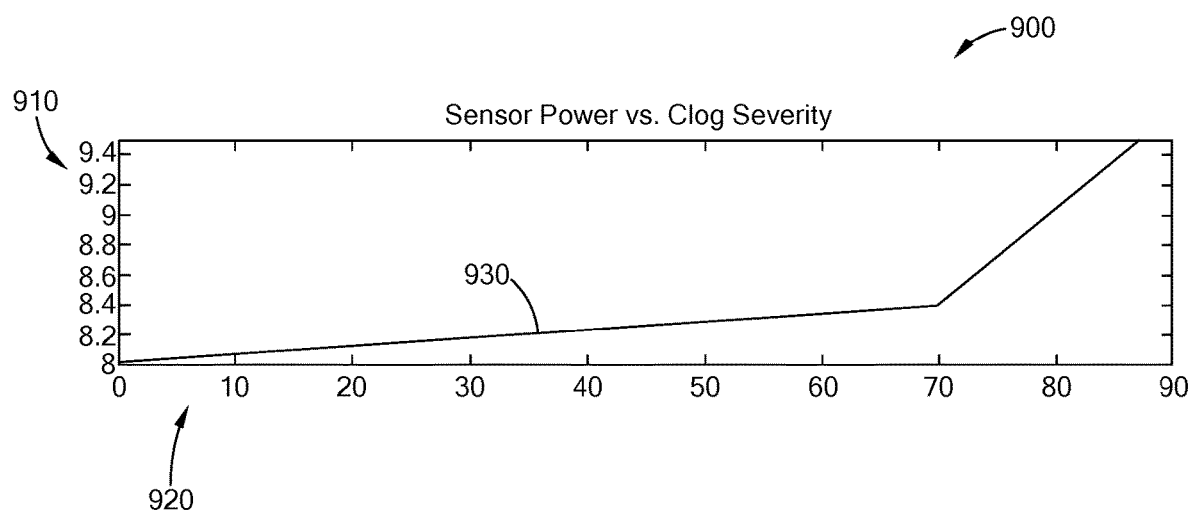
FIG. 9 is a graph illustrating the relationship between power data and material build-up according to the present disclosure.

In another example, for step 312, the controller 210 correlates electrical data with the amount of material build-up. Specifically, FIG. 9 illustrates a graph 900 that correlates the sensor power consumption data (y-axis 910), as the power data, to the amount of material build-up (x-axis 920). The controller 210 may determine, for a given fluid flow rate and given heater power (e.g., the excitation signal has a predetermined electrical power), the power consumption of the heating element 206 of the sensor 202, as illustrated by plot 930, which indicates that higher levels of power consumption correlate to increased amounts of material build-up. Accordingly, the controller 210 may determine the amount of material build-up within the conduit 120 based on the power consumption of the sensor 202.

Optionally, at step 314, the controller 210 utilizes the system level data in conjunction with at least one of the thermodynamic data and the electrical data to determine the amount of material build-up. As an example, the controller 210 may further refine the material build-up prediction based on, as the system level data, an inlet temperature, the composition of the fluid flowing through the conduit 120, and/or thermocouple data from one or more thermocouples disposed along and/or proximate the conduit 120 to adjust or validate the material build-up prediction determined based on the electrical and/or thermodynamic data.

Referring back to FIG. 3, at 316, the controller 210 determines whether the amount of material build-up is greater than a threshold material build-up value. If the amount of material build-up is greater than the threshold material build-up value, the routine 300 proceeds to 320, where the controller 210 generates an alert indicating a restricted fluid flow passage within the conduit 120. The alert may indicate that a maintenance action is needed at a particular location at the conduit 120 and/or a type of maintenance action needed at the particular location. The alert is communicated to a remote computing system, a display communicatively coupled to the controller 210, among others, to notify a user of the maintenance action. Otherwise, if the amount of material build-up is less than the threshold material build-up value at 316, the routine 300 ends.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

Spatial and functional relationships between elements are described using various terms, including "connected," "engaged," "coupled," "adjacent," "next to," "on top of," "above," "below," and "disposed." Unless explicitly being described as being "direct," when a relationship between first and second elements is described in the present disclosure, that relationship can be a direct relationship where no other intervening elements are present between the first and second elements, and can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and nontransitory.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of detecting accumulation of material deposits within a fluid flow conduit, the method comprising:
   providing, by a controller, an excitation signal to a heating element of the fluid flow conduit and a second heating element of the fluid flow conduit, wherein the excitation signal has a predetermined electrical power, the heating element is provided proximate to a first location of the fluid flow conduit, and the second heating element is provided proximate to a second location of the fluid flow conduit;
   obtaining a first temperature and a second temperature of the fluid flow conduit in response to providing the excitation signal, wherein the first temperature is associated with the first location, and the second temperature is associated with the second location;
   obtaining, by the controller, thermodynamic data of the fluid flow conduit in response to providing the excitation signal, wherein the thermodynamic data includes heat flux data, diffusivity data, time data, temperature differential data, or a combination thereof; and
   determining, by the controller, an amount of material deposits based on the thermodynamic data.

2. The method of claim 1, wherein the thermodynamic data includes the heat flux data, and wherein the method further comprises:
   determining an aperture size of the fluid flow conduit based on the heat flux data, wherein the amount of material deposits is further based on the aperture size.

3. The method of claim 1, wherein:
   the excitation signal has a predetermined pulse length;
   the thermodynamic data includes the diffusivity data; and
   the diffusivity data indicates a measured thermal diffusivity as a function of the predetermined pulse length.

4. The method of claim 1 further comprising providing the excitation signal to the heating element to have a temperature of the fluid flow conduit reach a first setpoint temperature, wherein:
   the thermodynamic data includes the time data; and
   the time data indicates an amount of time to have the temperature of the fluid flow conduit reach a second setpoint temperature, wherein the second setpoint temperature is less than the first setpoint temperature.

5. The method of claim 1 further comprising obtaining a temperature of the fluid flow conduit in response to providing the excitation signal, wherein:
   the excitation signal has a predetermined electrical power and a setpoint temperature of the fluid flow conduit associated with the predetermined electrical power;
   the thermodynamic data includes the temperature differential data; and
   the temperature differential data indicates a temperature difference between the temperature and the setpoint temperature.

6. The method of claim 5, wherein the temperature and the setpoint temperature are associated with a predetermined location of the fluid flow conduit.

7. The method of claim 1 wherein:
   the excitation signal has a predetermined electrical power,
   the thermodynamic data includes the temperature differential data, and
   the temperature differential data indicates a temperature difference between the first temperature and the second temperature.

8. The method of claim 1 further comprising determining the amount of material deposits based on a fluid flow rate of the fluid flow conduit.

9. The method of claim 1 further comprising generating an alert in response to the amount of material deposits exceeding a threshold value.

10. The method of claim 1, wherein the heating element is integrated with the fluid flow conduit.

11. The method of claim 1, wherein the heating element is disposed on an exterior surface of the fluid flow conduit.

12. A method of detecting accumulation of material deposits within a fluid flow conduit, the method comprising:
providing, by a controller, an excitation signal to a heating element of the fluid flow conduit and a second heating element of the fluid flow conduit, the heating element is provided proximate to a first location of the fluid flow conduit, and the second heating element is provided proximate to a second location of the fluid flow conduit, wherein the excitation signal includes an amplitude indicative of at least one of a voltage magnitude, a current magnitude, or a power magnitude;
obtaining a first temperature and a second temperature of the fluid flow conduit in response to providing the excitation signal, wherein the first temperature is associated with the first location, and the second temperature is associated with the second location;
obtaining, by the controller, electrical data of the heating element in response to providing the excitation signal, wherein the electrical data indicates a voltage, an electric current, or a combination thereof; and
determining, by the controller, an amount of material deposits based on the electrical data.

13. The method of claim 12, wherein the electrical data indicates a power consumption of the heating element when the excitation signal has a predetermined electrical power.

14. The method of claim 12 further comprising determining the amount of material deposits based on a fluid flow rate of the fluid flow conduit.

15. The method of claim 12 further comprising generating an alert in response to the amount of material deposits exceeding a threshold value.

16. The method of claim 12, wherein the heating element is integrated with the fluid flow conduit.

17. The method of claim 12, wherein the heating element is disposed on an exterior surface of the fluid flow conduit.

18. A system for detecting accumulation of material deposits within a fluid flow conduit, the system comprising:
a processor; and
a nontransitory computer-readable medium comprising instructions that are executable by the processor, wherein the instructions comprise:
providing an excitation signal to a heating element of the fluid flow conduit and a second heating element of the fluid flow conduit, wherein the excitation signal has a predetermined electrical power, the heating element is provided proximate to a first location of the fluid flow conduit, and the second heating element is provided proximate to a second location of the fluid flow conduit, wherein the excitation signal has a predetermined electrical power;
obtaining a first temperature and a second temperature of the fluid flow conduit in response to providing the excitation signal, wherein the first temperature is associated with the first location, and the second temperature is associated with the second location;
obtaining thermodynamic data of the fluid flow conduit in response to providing the excitation signal, wherein the thermodynamic data includes heat flux data, diffusivity data, time data, temperature differential data, or a combination thereof; and
determining an amount of material deposits based on the thermodynamic data, the predetermined electrical power, and a fluid flow rate of the fluid flow conduit.

19. The system of claim 18, wherein the thermodynamic data includes the heat flux data, and wherein the instructions further comprise:
determining an aperture size of the fluid flow conduit based on the heat flux data, wherein the amount of material deposits is further based on the aperture size.

20. The system of claim 18, wherein:
the excitation signal has a predetermined pulse length;
the thermodynamic data includes the diffusivity data; and
the diffusivity data indicates a measured thermal diffusivity as a function of the predetermined pulse length.

21. The system of claim 18, wherein the instructions further comprise providing the excitation signal to the heating element to have a temperature of the fluid flow conduit reach a first setpoint temperature, wherein:
the thermodynamic data includes the time data; and
the time data indicates an amount of time to have the temperature of the fluid flow conduit reach a second setpoint temperature, wherein the second setpoint temperature is less than the first setpoint temperature.

22. The system of claim 18, wherein the instructions further comprise obtaining a temperature of the fluid flow conduit in response to providing the excitation signal, wherein:
the thermodynamic data includes the temperature differential data; and
the temperature differential data indicates a temperature difference between the temperature and a setpoint temperature of the fluid flow conduit associated with the predetermined electrical power.

23. The system of claim 22, wherein the temperature and the setpoint temperature are associated with a predetermined location of the fluid flow conduit.

24. The system of claim 18, wherein:
the excitation signal has a predetermined electrical power,
the thermodynamic data includes the temperature differential data, and
the temperature differential data indicates a temperature difference between the first temperature and the second temperature.

* * * * *